United States Patent
Nomura et al.

(10) Patent No.: US 9,234,271 B2
(45) Date of Patent: Jan. 12, 2016

(54) RADIATION IMAGING APPARATUS, METHOD OF MANUFACTURING THE SAME, AND RADIATION INSPECTION APPARATUS

(71) Applicant: CANON KABUSHIKI KAISHA, Tokyo (JP)

(72) Inventors: Keiichi Nomura, Honjo (JP); Yohei Ishida, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/318,873

(22) Filed: Jun. 30, 2014

(65) Prior Publication Data

US 2015/0021486 A1    Jan. 22, 2015

(30) Foreign Application Priority Data

Jul. 16, 2013    (JP) ................. 2013-147922

(51) Int. Cl.
| | |
|---|---|
| *C23C 14/24* | (2006.01) |
| *G01T 1/20* | (2006.01) |
| *C23C 14/06* | (2006.01) |
| *C23C 14/14* | (2006.01) |
| *C23C 14/50* | (2006.01) |

(52) U.S. Cl.
CPC ............ *C23C 14/24* (2013.01); *C23C 14/0694* (2013.01); *C23C 14/14* (2013.01); *C23C 14/505* (2013.01); *G01T 1/20* (2013.01)

(58) Field of Classification Search
CPC .... C23C 14/0694; C23C 14/14; C23C 14/24; C23C 14/505; G01T 1/20
See application file for complete search history.

(56) References Cited

U.S. PATENT DOCUMENTS

| | | | |
|---|---|---|---|
| 6,933,502 B2 | 8/2005 | Okada et al. | 250/367 |
| 7,692,152 B2 | 4/2010 | Inoue | 250/361 R |
| 8,212,220 B2 * | 7/2012 | Lerch | G01T 1/161 250/366 |
| 8,648,312 B2 | 2/2014 | Ichimura et al. | 250/367 |
| 8,653,465 B2 | 2/2014 | Nagano et al. | 250/369 |
| 8,704,185 B2 | 4/2014 | Ishida et al. | 250/369 |
| 2002/0130258 A1 * | 9/2002 | Odom | G01T 3/06 250/269.6 |
| 2009/0261254 A1 | 10/2009 | Sakurai et al. | 250/361 R |
| 2010/0276602 A1 * | 11/2010 | Clothier | G01T 3/06 250/362 |
| 2011/0012216 A1 * | 1/2011 | Morichi | G01T 1/2928 257/429 |
| 2013/0134312 A1 | 5/2013 | Nagano et al. | 250/363.01 |
| 2013/0168559 A1 | 7/2013 | Saruta et al. | 250/366 |
| 2013/0308755 A1 | 11/2013 | Ishida et al. | 378/62 |
| 2013/0341516 A1 | 12/2013 | Ishida et al. | 250/363.02 |
| 2014/0008749 A1 | 1/2014 | Nomura et al. | 257/432 |
| 2014/0034836 A1 | 2/2014 | Takei et al. | 250/366 |
| 2014/0091225 A1 | 4/2014 | Sasaki et al. | 250/366 |
| 2014/0103216 A1 | 4/2014 | Sasaki et al. | 250/361 R |

FOREIGN PATENT DOCUMENTS

| | | |
|---|---|---|
| JP | 2003-066147 | 3/2003 |
| JP | 2004-037363 | 2/2004 |

(Continued)

*Primary Examiner* — Mark R Gaworecki
(74) *Attorney, Agent, or Firm* — Fitzpatrick, Cella, Harper & Scinto

(57) ABSTRACT

A radiation imaging apparatus, comprising a sensor panel including a plurality of sensors arranged on a substrate and configured to detect light, and a scintillator placed over the sensor panel, wherein the scintillator having a concentric characteristics distribution having a center outside an outer edge of the scintillator.

13 Claims, 7 Drawing Sheets

(56) References Cited

FOREIGN PATENT DOCUMENTS

| | | |
|---|---|---|
| JP | 2005-351762 | 12/2005 |
| JP | 2007-232636 | 9/2007 |
| JP | 2007-270297 | 10/2007 |
| JP | 2009-258054 | 11/2009 |

\* cited by examiner

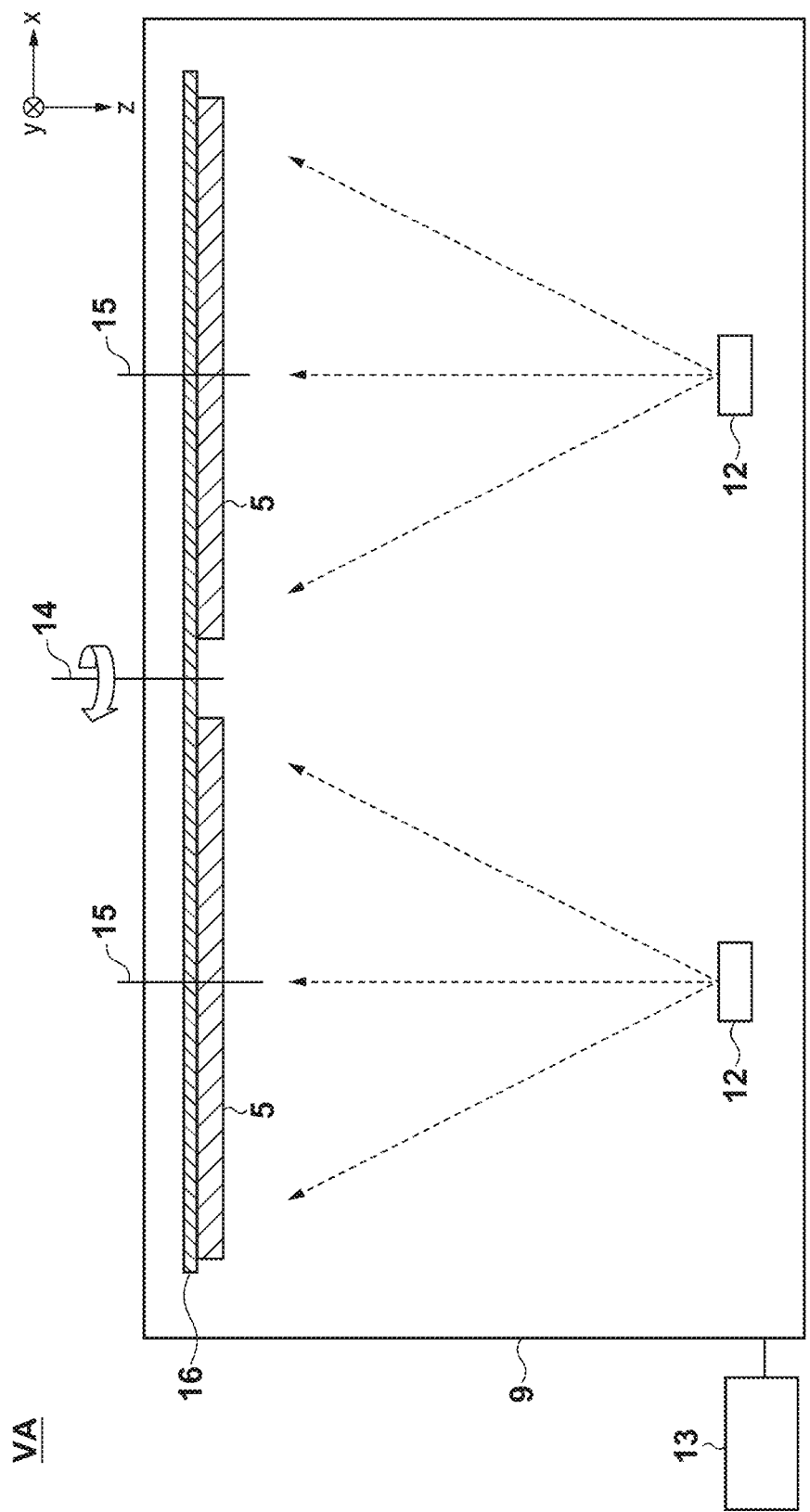

RADIATION IMAGING APPARATUS, METHOD OF MANUFACTURING THE SAME, AND RADIATION INSPECTION APPARATUS

BACKGROUND OF THE INVENTION

1. Field of the Invention

The present invention relates to a radiation imaging apparatus, a method of manufacturing the same, and a radiation inspection apparatus.

2. Description of the Related Art

A radiation imaging apparatus includes a sensor panel having a plurality of sensors configured to detect light and arranged on a substrate and a scintillator placed over the sensor panel. The scintillator, for example, can be formed over the sensor panel by using an evaporative apparatus which performs a vapor deposition process (rotating and vapor deposition) while rotating a vapor deposition target.

It is possible to improve the production efficiency of a radiation imaging apparatus by simultaneously forming scintillators over a plurality of sensor panels. In this case, the scintillators formed over the respective sensor panels can have different characteristics depending on how the respective sensor panels are mounted on the evaporative apparatus which performs the above rotating and vapor deposition. For example, the scintillator formed over a sensor panel mounted in a central region of a holder which holds a vapor deposition target can have characteristics different from those of the scintillator formed over a sensor panel placed in a peripheral region of the holder. This can cause characteristic variations among manufactured radiation imaging apparatuses.

SUMMARY OF THE INVENTION

The present invention provides a technique advantageous in reducing characteristic variations among radiation imaging apparatuses while improving production efficiency.

One of the aspects of the present invention provides a radiation imaging apparatus, comprising a sensor panel including a plurality of sensors arranged on a substrate and configured to detect light, and a scintillator placed over the sensor panel, wherein the scintillator having a concentric characteristics distribution having a center outside an outer edge of the scintillator.

Further features of the present invention will become apparent from the following description of exemplary embodiments with reference to the attached drawings.

BRIEF DESCRIPTION OF THE DRAWINGS

FIG. 1 is a view for explaining an example of the arrangement of an evaporative apparatus for forming scintillators;

DESCRIPTION OF THE EMBODIMENTS

Figure 2A:
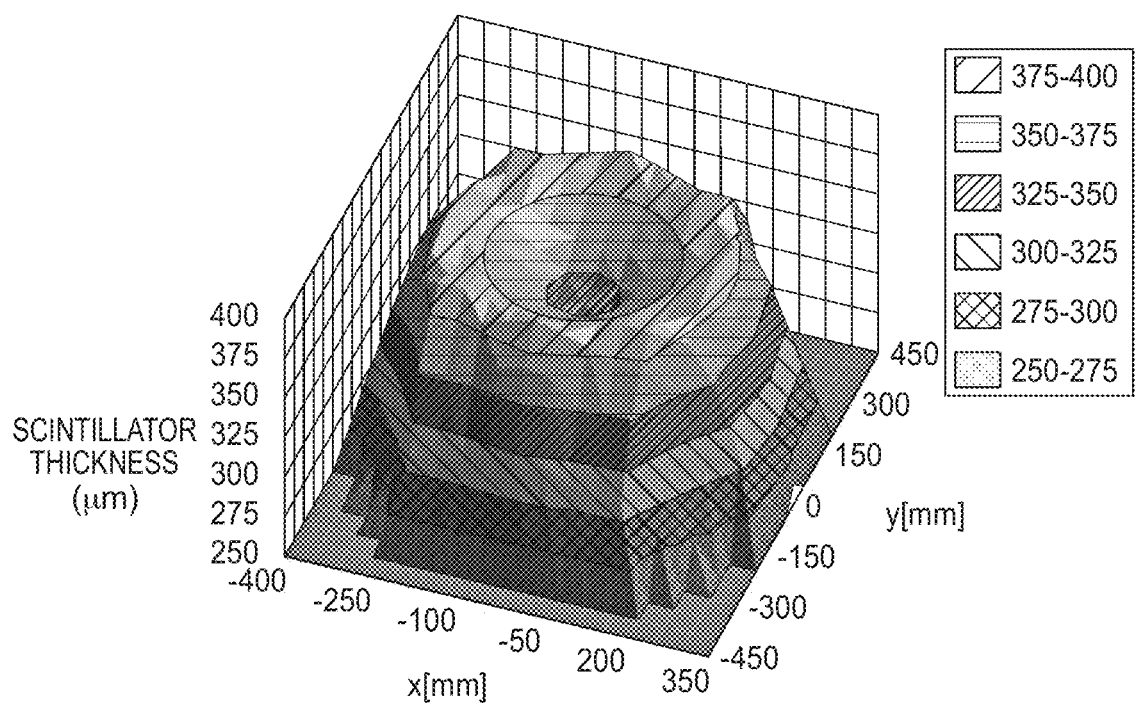
FIGS. 2A and 2B are views for explaining an example of a simulation result of a scintillator thickness distribution.

A radiation imaging apparatus according to the present invention is applied to an imaging system typified by a radiation inspection apparatus. The imaging system can include, for example, a radiation imaging apparatus, a signal processor including an image processor, a display unit including a display, and a radiation source for generating radiation (X-rays, $\alpha$-rays, $\beta$-rays, $\gamma$-rays, or the like). Radiation from the radiation source passes through a subject to be examined. The radiation imaging apparatus detects the radiation having internal information of the subject. The radiation imaging apparatus generates a radiation image from the detected radiation information, and makes, for example, an information processor perform predetermined information processing to generate image data based on the information. The display unit displays this image data.

Each embodiment to be described below will exemplify a so-called indirect conversion type radiation imaging apparatus including a sensor panel having a plurality of sensors configured to detect light and arranged on a substrate and a scintillator placed over the sensor panel. The scintillator converts radiation passing through a subject to be examined into light. Each sensor of the sensor panel detects the light. Image data is then generated based on the light.

First Embodiment

A radiation imaging apparatus $RA_1$ according to the first embodiment will be described below with reference to FIGS. 1 to 6.

An evaporative apparatus VA for forming scintillators will be described first. FIG. 1 schematically exemplifies the arrangement of the evaporative apparatus VA. The evaporative apparatus VA can include, for example, a vacuum chamber 9 for performing a vapor deposition process, a vacuum pump 13 for setting the vacuum chamber 9 in a nearly vacuum state by evacuating the chamber to a pressure lower than a predetermined pressure, and a holder 16 for holding vapor deposition targets. The evaporative apparatus VA can perform a vapor deposition process for the vapor deposition targets held by the holder 16 while rotating the holder 16. A central axis 14 indicates the rotation center of the holder 16. Evaporation sources 12 are placed immediately below centers 15 of the vapor deposition targets. The evaporation sources 12 can be filled with a scintillator material. It is possible to use CsI (cesium iodide), NaI (sodium iodide), or the like as a scintillator material and to use Tl (thallium), Na (sodium), or the like as a doping agent (activator).

For example, it is possible to form a scintillator on the vapor deposition target held by the holder 16 by heating and evaporating the scintillator material of the evaporation source 12 using a resistance heating method of supplying a current to the evaporation source 12. Assume that in this case, a plane parallel to the surface of the holder 16 is formed, two axes intersecting with each other are defined as the x-axis direction and the y-axis direction, respectively, and the direction in which a scintillator is formed is defined as the z-axis direction.

A plurality of sensor panels 5 as vapor deposition targets can be mounted at positions away from the central axis 14 of the holder 16 so as to surround the central axis 14. The following will exemplify a case in which the two sensor panels 5 are mounted at positions away from the central axis 14 of the holder 16 so as to to be located on both sides of the central axis 14.

Figure 2B:
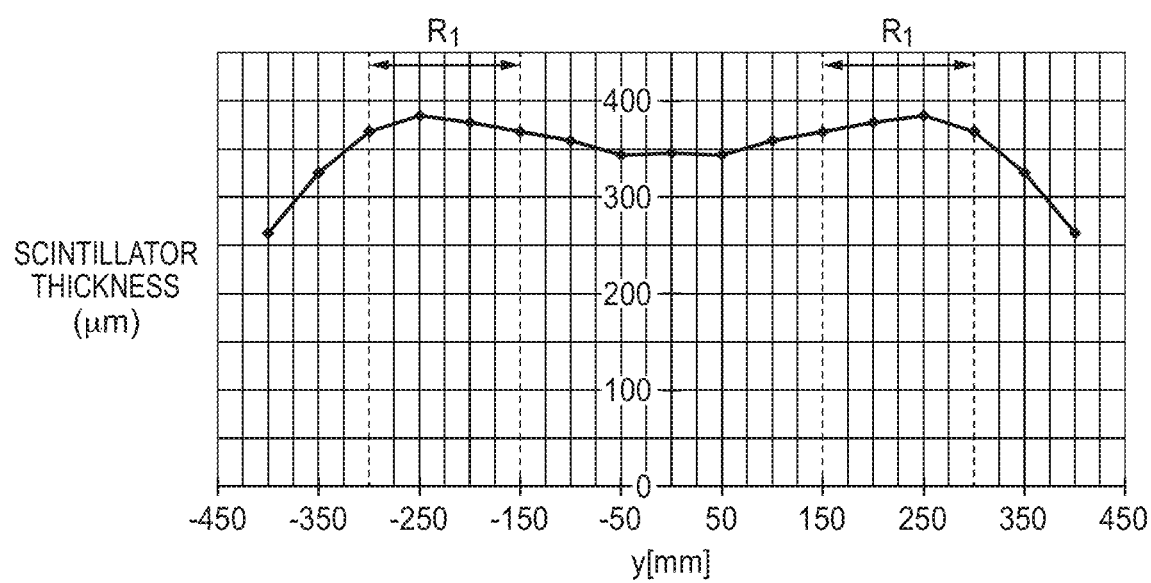

FIG. 2A exemplifies a simulation result of the thickness distribution of scintillators formed by the above vapor deposition method. FIG. 2B is a graph obtained by plotting the thickness distribution of the scintillators, with the abscissa representing the distance [mm] from the central axis 14 (y-axis, x=0), and the ordinate representing the scintillator thickness [μm]. Referring to FIG. 2B, scintillator thicknesses are large in a range $R_1$ of 150 [mm]≤|y|≤300 [mm]. Therefore, in the range $R_1$, the characteristics distribution of a scintillator (for example, a DQE (Detective Quantum Efficiency) distribution) can take large values. It is therefore preferable to mount sensor panels in the range $R_1$.

Figure 3A:
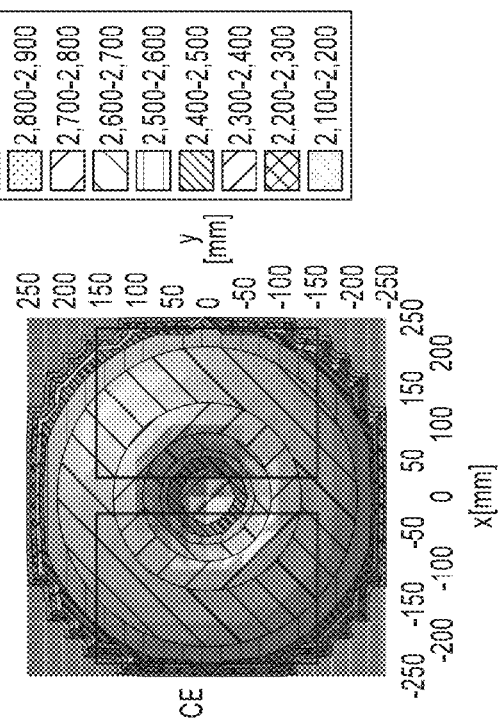
FIGS. 3A to 3C are views for explaining an example of a simulation result of a scintillator luminance distribution.
Figure 3B:
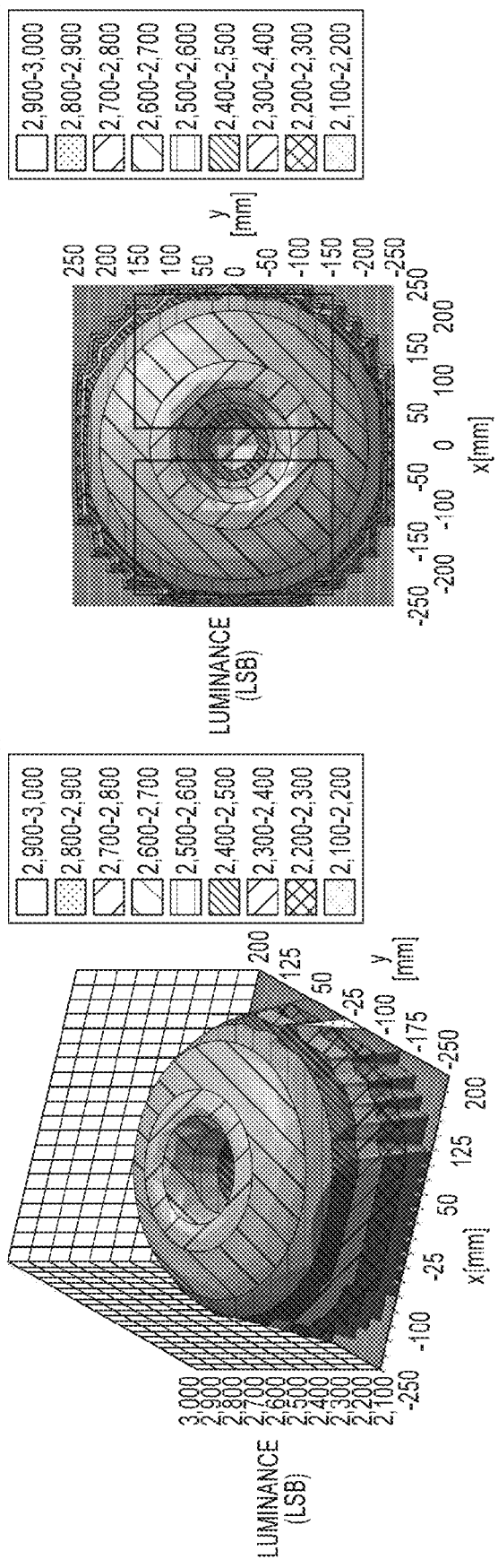
Figure 3C:
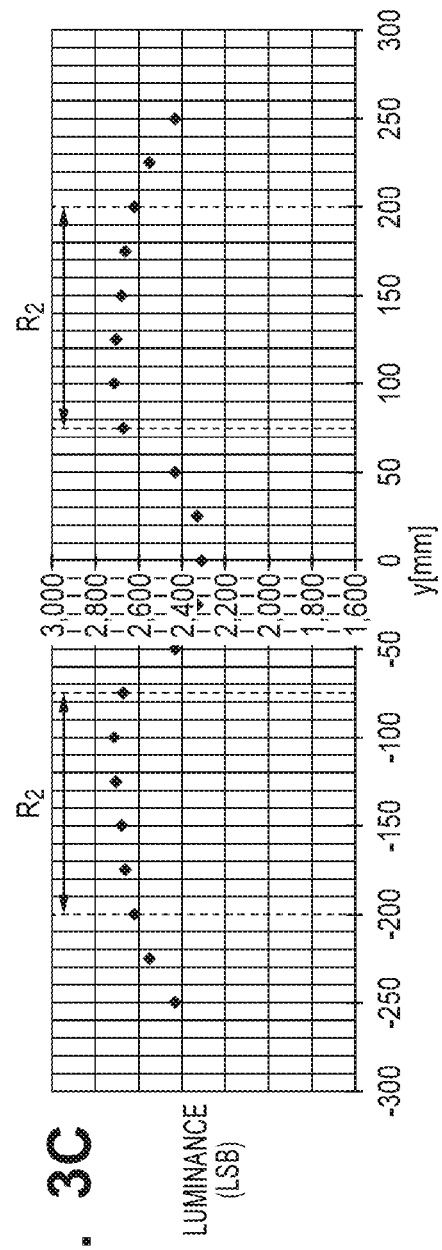

FIG. 3A exemplifies a simulation result of the luminance distribution (the emission intensity distribution obtained upon irradiation of uniform radiation) of scintillators formed by the above vapor deposition method. FIG. 3B schematically exemplifies the luminance distribution in a planar view with respect to the plane formed by the x-axis and the y-axis and the positions at which the sensor panels 5 should be mounted. FIG. 3C shows a graph obtained by plotting a luminance distribution, with the abscissa representing the distance [mm] from the central axis 14 (y-axis, x=0), and the ordinate representing the scintillator luminance [LSB]. Referring to FIG. 3C, the luminances are high in a range $R_2$ of 75 [mm]≤|y|≤200 [mm]. Therefore, a sensor panel is preferably set such that its center is located in the range $R_2$. In consideration of the above thickness distribution and the DQE distribution, the center of a sensor panel is preferably located in the range of 150 [mm]≤|y|≤200 [mm].

Figure 4A:
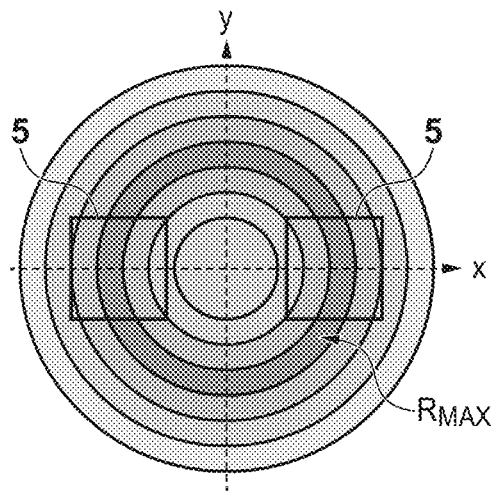
FIGS. 4A to 4C are views for explaining an example of a radiation imaging apparatus according to the present invention.
Figure 4B:
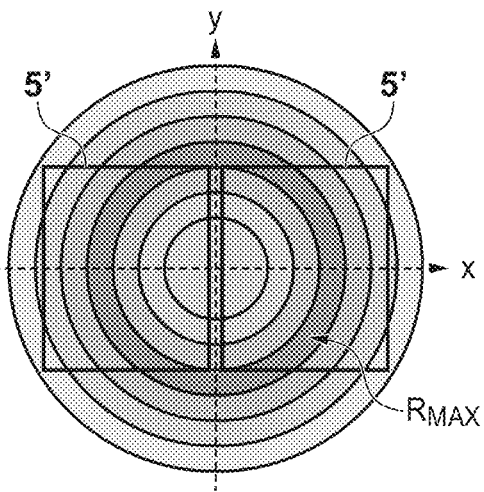
Figure 4C:
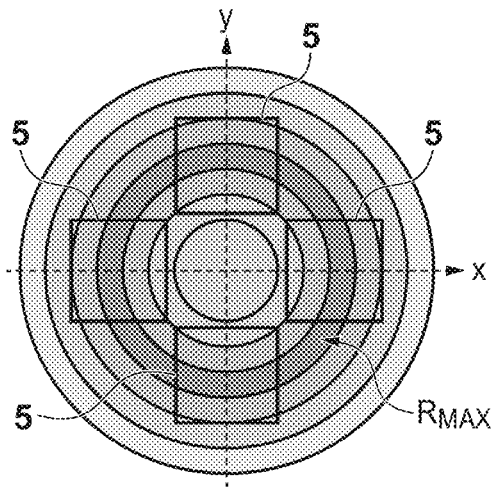

A mode of directly forming a scintillator on the sensor panel 5 by the above vapor deposition method will be described next. FIGS. 4A to 4C each schematically exemplify a scintillator thickness distribution in a planar view with respect to the plane formed by the x-axis and the y-axis and the positions at which the sensor panels 5 should be mounted. FIG. 4A shows a case in which two small-size sensor panels 5 are mounted. The two sensor panels 5 are mounted at positions away from the central axis 14 so as to be located, for example, on both sides of the central axis 14.

In addition, as indicated by FIG. 4A, the magnitudes of scintillator thicknesses in the scintillator thickness distribution are indicated by a graded gray scale. A region in which the scintillator thickness becomes the maximum value is indicated by a region $R_{MAX}$. The two sensor panels 5 can be arranged such that their centers are located in the region $R_{MAX}$.

In addition, the two sensor panels 5 can be arranged such that a virtual straight line passing through the rotation center (central axis 14) is parallel to two opposite sides of the sensor panels 5. This makes it possible to form scintillators on the sensor panels 5 such that a characteristics distribution has symmetry. In addition, the two sensor panels 5 can be arranged at an equal distance from the rotation center. This can make the scintillators formed on the respective sensor panels 5 have nearly the same characteristics.

FIG. 4B shows a case, as another example, in which two large-size sensor panels 5' are arranged. These panels may be arranged at positions away from the rotation center (central axis 14) as in the case of FIG. 4A. That is, the rotation center may be located outside the sensor panels 5'. In addition, FIG. 4C shows a case, as still another example, in which four small-size sensor panels 5 are mounted. These panels can be mounted to surround the rotation center. For example, they can be mounted vertically and horizontally with reference to the rotation center. Although the case in which the two or four sensor panels are mounted has been exemplified, the number of sensor panels mounted is not limited to the exemplified values.

Figure 5A:
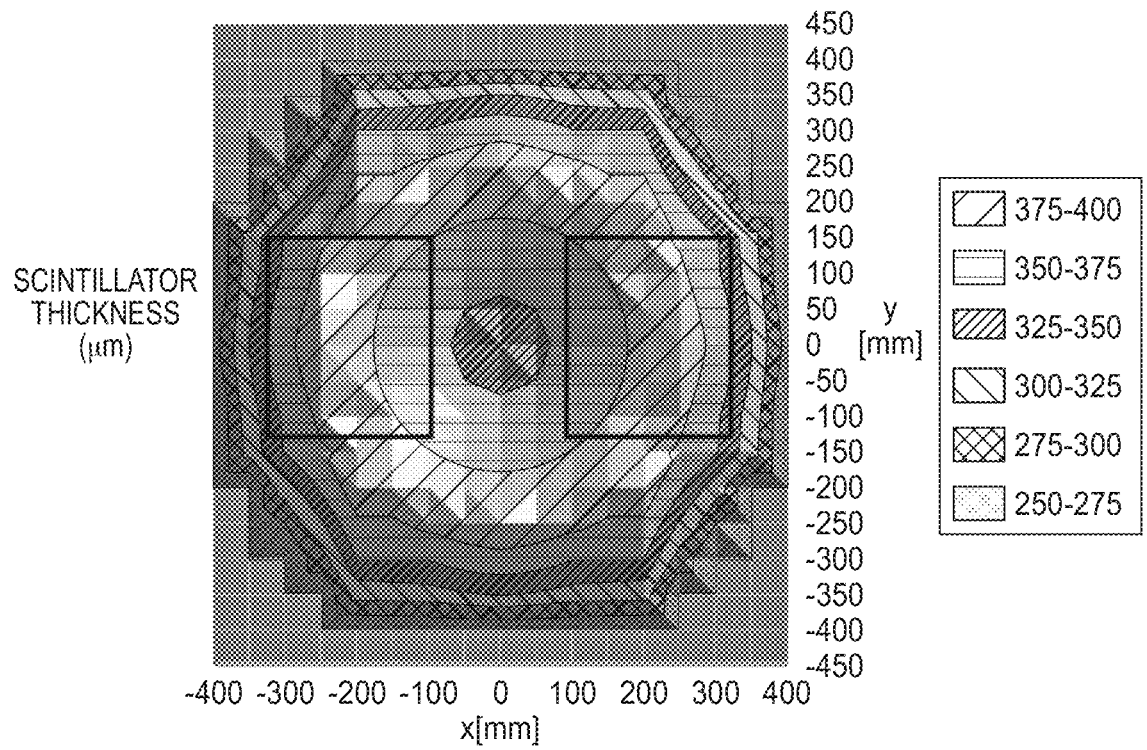
FIGS. 5A and 5B are views for explaining an example of a scintillator thickness distribution and an example of a method of mounting sensor panels.
Figure 5B:
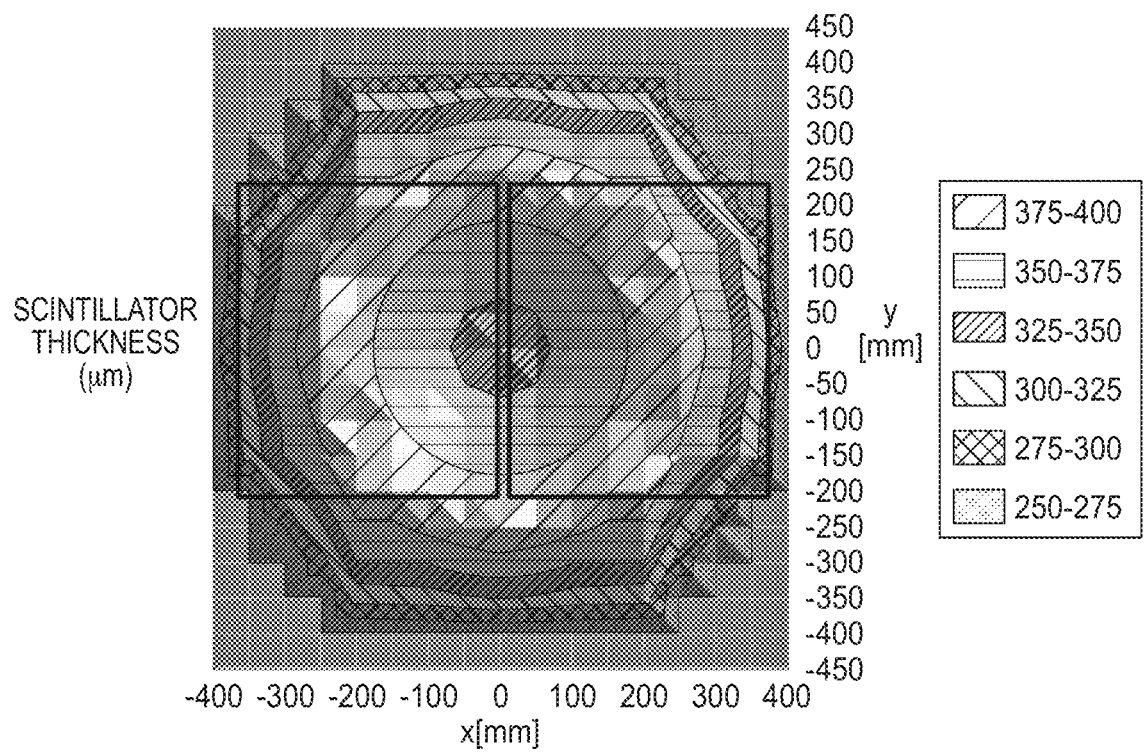

FIGS. 5A and 5B each schematically exemplify a scintillator thickness distribution as the simulation result shown in FIG. 2A and the positions at which two sensor panels should be mounted. FIG. 5A exemplifies a case in which two small-size sensor panels 5 (in this case, 230 [mm] in the x-axis direction and 280 [mm] in the y-axis direction) are mounted. FIG. 5B exemplifies a case in which two large-size sensor panels 5' (in this case, 350 [mm] in the x-axis direction and 430 [mm] in the y-axis direction) are mounted. Arranging the sensor panels 5 or 5' (to be simply referred to as the sensor panels 5 hereinafter) in the above manner makes it possible to locate a portion, of the scintillator formed, which has the maximum value of thickness in the central region of each sensor panel 5. In addition, each scintillator is formed such that the minimum and maximum values of thickness are distributed in a direction along the x-axis of the sensor panels 5, while the thickness of a portion extending in a direction along the y-axis of the sensor panels 5 is constant. According to this structure, the scintillator having good characteristics exists in a region, of the sensor panels 5, in which the existence probability of a subject is higher. This suppresses a reduction in diagnostic efficiency which can be caused by the characteristics distribution of the scintillator.

Figure 6:
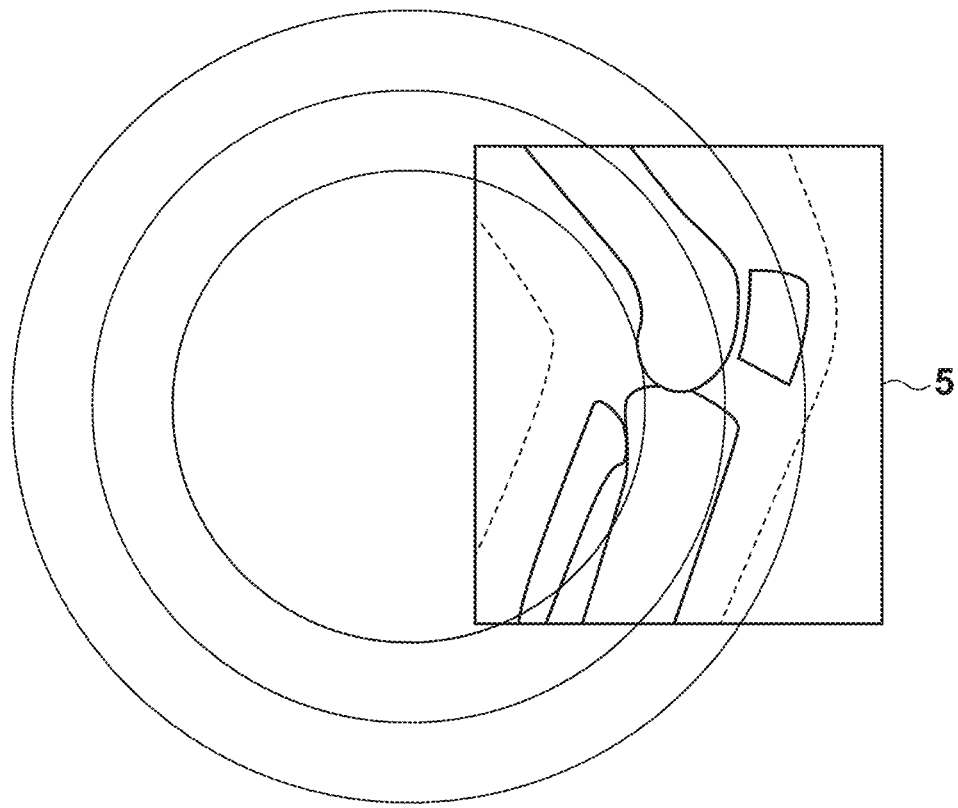
FIG. 6 is a view for explaining an example of a radiation image obtained by the radiation imaging apparatus according to the present invention.

As described above, the evaporative apparatus VA which performs a vapor deposition process while rotating the holder 16 for holding vapor deposition targets is used to form scintillators, by a vapor deposition process, on the plurality of sensor panels 5 as vapor deposition targets which are mounted at positions away from the rotation center (central axis 14) of the holder 16. A vapor deposition process is performed so as to locate the maximum value of the characteristics distribution of each scintillator in the central region of the sensor panel 5. Note that the sensor panel 5 obtained in this manner has a concentric characteristics distribution having a center outside the outer edge of the sensor panel. For example, as shown in FIG. 6, such a sensor panel is suitable when imaging a subject from a side surface of the knee.

As described above, this embodiment can simultaneously form scintillators over the plurality of sensor panels 5. It is therefore possible to simultaneously manufacture a plurality of radiation imaging apparatuses $RA_1$. This is advantageous in improving the production efficiency of the radiation imaging apparatuses $RA_1$. For example, it is possible to reduce the manufacturing cost. In addition, according to this embodiment, the respective sensor panels 5 may be mounted on the holder 16 so as to surround the rotation center, and it is possible to make the scintillators formed over the respective sensor panels 5 have almost the same characteristics. This can reduce characteristic variations among the plurality of manufactured radiation imaging apparatuses $RA_1$. In addition, in this embodiment, scintillators over the plurality of sensor panels 5 are simultaneously formed such that each scintillator includes a portion exhibiting the maximum value of the characteristics distribution. Therefore, the embodiment is advantageous in improving the quality of the plurality of radiation imaging apparatuses $R_1$ simultaneously manufactured in the above manner.

Second Embodiment

Figure 7:
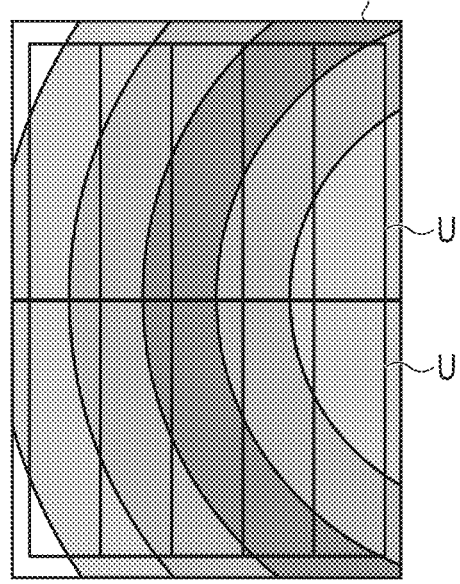
FIG. 7 is a view for explaining another example of the radiation imaging apparatus according to the present invention.

A radiation imaging apparatus $RA_2$ according to the second embodiment will be described with reference to FIG. 7. The first embodiment has exemplified the mode of directly forming scintillators on sensor panels. However, the present invention is not limited to this. For example, as exemplified by FIG. 7, the radiation imaging apparatus $RA_2$ may be manufactured by forming a scintillator on a base 20 formed from amorphous carbon (a-C), aluminum (Al), or the like and bonding the base 20, on which the scintillator is formed, on a sensor panel $5_2$.

As the sensor panel $5_2$ in this embodiment, it is possible to use a panel obtained by tiling (two-dimensionally arranging) a plurality of sensor units such as CMOS sensors or CCD sensors on a substrate. For the sake of descriptive convenience, FIG. 7 shows the sensor panel $5_2$ having sensor units tiled into 2 rows×5 columns. In this case, a scintillator may be provided such that a column near the middle of the five columns (in this case, the third column) exhibits the maximum value in the characteristics distribution. That is, the sensor unit on the third column can be placed to be located in a region $R_{MAX}$ (a region in which the scintillator thickness takes the maximum value) described above. Note that in this case, for the sake of descriptive convenience, this embodiment has exemplified the sensor panel $5_2$ having sensor units tilted into 2 rows×5 columns. However, the embodiment is not limited to these numbers of rows and columns.

As described above, using the above manufacturing method can simultaneously form the plurality of radiation imaging apparatuses $RA_2$ as in the first embodiment. This is advantageous in improving production efficiency, and can reduce characteristic variations among apparatuses.

Third Embodiment

Figure 8:
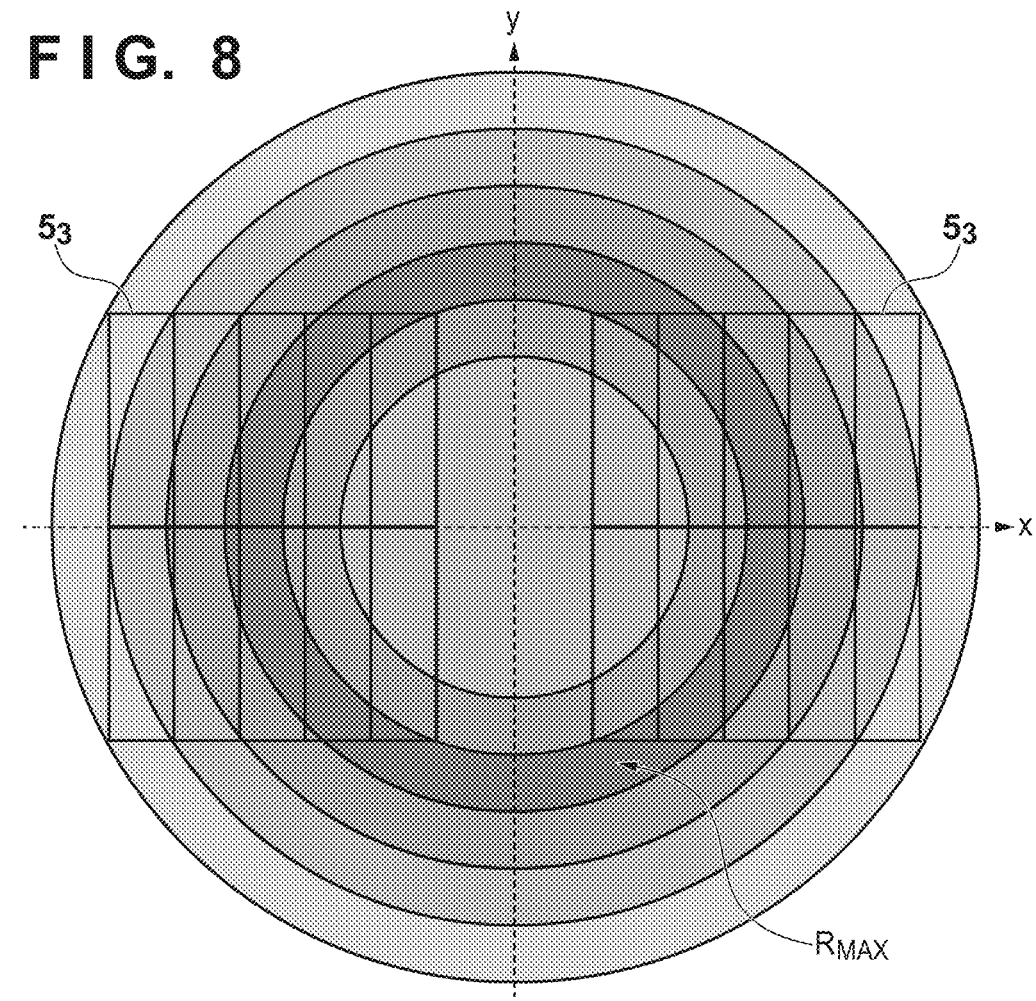
FIG. 8 is a view for explaining still another example of the radiation imaging apparatus according to the present invention.

A radiation imaging apparatus $RA_3$ according to the third embodiment will be described with reference to FIG. 8. This embodiment differs from the second embodiment in that it directly forms, by a vapor deposition method, a scintillator on a sensor panel $5_3$ on which a plurality of sensor units such as CMOS sensors or CCD sensors are tiled. Note that for the sake of descriptive convenience, the embodiment has exemplified the sensor panel $5_3$ on which sensor units are tiled into 2 rows×5 columns. However, the embodiment is not limited to these numbers of rows and columns.

In this case, the embodiment exemplifies a case in which the two sensor panels $5_3$ are mounted on a holder 16. The two sensor panels $5_3$ are both mounted at positions away from a central axis 14 so as to, for example, be located on both sides of the central axis 14 as exemplified in FIG. 8. In this case, each of the two sensor panels $5_3$ can be placed such that a column near the middle of five columns (in this case, the third column) is located in a region $R_{MAX}$ (a region in which the scintillator thickness takes the maximum value) described above.

As described above, using the above manufacturing method can simultaneously form the plurality of radiation imaging apparatuses $RA_3$ as in each embodiment described above. This is advantageous in improving production efficiency, and can reduce characteristic variations among apparatuses.

(Others)

A scintillator has a concentric characteristics distribution having a center outside the outer edge of the scintillator, and hence the pixel sensitivity of each sensor in the sensor panel 5 may be corrected in accordance with the characteristics distribution. On the other hand, the characteristics distribution of the scintillator exhibits that the amounts of change are large in the x-axis direction, and the amounts of change are small in the y-axis direction. Therefore, correction processing may be performed in accordance with a characteristics distribution in the x-axis direction, whereas no correction processing may be performed in the y-axis direction (or correction processing is performed with a smaller correction amount than that with which correction processing is performed in the x-axis direction).

Figure 9:
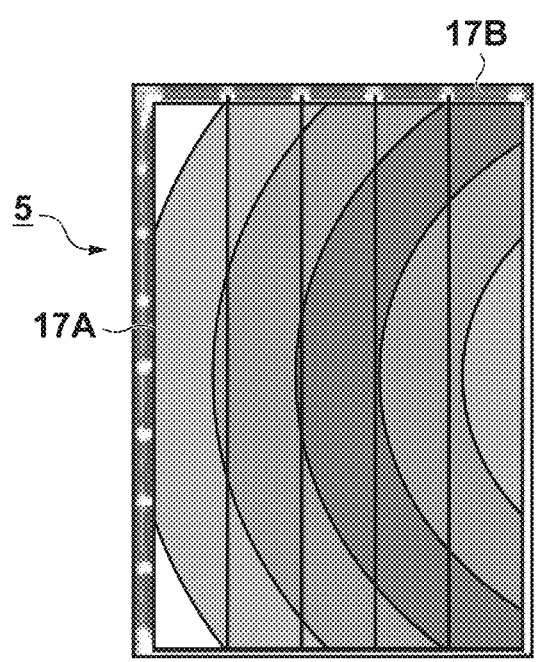
FIG. 9 is a view for explaining the driving unit and readout unit of the radiation imaging apparatus.

FIG. 9 is a view for explaining a method of driving the radiation imaging apparatus RA obtained in each embodiment described above. The radiation imaging apparatus RA includes a driving unit 17A which drives the sensor panel 5 and a readout unit 17B for reading out signals from the sensor panel 5. The readout unit 17B is constituted by, for example, a plurality of readout ICs, and can be placed on a side in the same direction as the x-axis direction on the sensor panel 5. The readout unit 17B may be formed in accordance with a characteristics distribution in the x-axis direction which changes along almost the y-axis direction.

Although the three embodiments have been described above, the present invention is not limited to them. The objects, states, applications, functions, and other specifications of the present invention can be changed as needed, and other embodiments can implement the present invention. For example, each embodiment described above has exemplified the mode of forming scintillators over sensor panels. Likewise, it is possible to manufacture a radiation imaging apparatus by forming a scintillator over a substrate and bonding the substrate on a sensor panel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-147922, filed Jul. 16, 2013, which is hereby incorporated by reference herein in its entirety.

What is claimed is:

1. A radiation imaging apparatus comprising:
   a sensor panel including a plurality of sensors arranged on a substrate and configured to detect light; and
   a scintillator placed over the sensor panel,
   wherein the scintillator has a concentric characteristics distribution having a center outside an outer edge of the scintillator.

2. The apparatus according to claim 1, wherein the characteristics distribution of the scintillator includes at least one of a luminance distribution and a detective quantum efficiency distribution of the scintillator.

3. The apparatus according to claim 2, wherein the scintillator is configured such that a portion, of at least one of the luminance distribution and the detective quantum efficiency distribution, which exhibits a maximum value is located in a central region of the scintillator.

4. The apparatus according to claim 1, wherein the scintillator has a concentric thickness distribution having a center outside an outer edge of the scintillator.

5. The apparatus according to claim 4, wherein the scintillator is configured such that a portion, of the thickness distribution, which exhibits a maximum value is located in a central region of the scintillator.

6. A radiation inspection apparatus comprising:
   a radiation imaging apparatus defined in claim 1;
   a signal processor configured to process a signal from the radiation imaging apparatus; and
   a radiation source configured to generate radiation.

7. A method of manufacturing a radiation imaging apparatus, the method comprising:
   mounting a plurality of sensor panels, each having a plurality of sensors configured to detect light and arranged on a substrate, at positions away from a rotation center of a holder of an evaporative apparatus configured to perform a vapor deposition process while holding vapor deposition targets with the holder and rotating the holder; and
   forming scintillators over the plurality of sensor panels so as to have a concentric characteristics distribution having a center outside an outer edge of each of the plurality of sensor panels by performing a vapor deposition process for the plurality of sensor panels mounted in the mounting the plurality of sensor panels while rotating the holder of the evaporative apparatus.

8. The method according to claim 7, wherein in forming the scintillators, a vapor deposition process is performed such that at least one of a luminance distribution and a detective quantum efficiency distribution of the scintillator has a maximum value at a position in a central region of the scintillator.

9. The method according to claim 7, wherein in forming the scintillators, a vapor deposition process is performed such that a thickness distribution of the scintillator has a maximum value at a position in a central region of the scintillator.

10. The method according to claim 7, wherein in mounting the plurality of sensor panels, the plurality of sensor panels are mounted such that a virtual straight line passing through a rotation center of the holder is parallel to two opposite sides of the sensor panels.

11. The method according to claim 7, wherein in mounting the plurality of sensor panels, the plurality of sensor panels are mounted so as to surround a rotation center of the holder.

12. A scintillator panel comprising a substrate and a scintillator placed over the substrate,
   wherein the scintillator has a concentric characteristics distribution having a center outside an outer edge of the scintillator.

13. A method of manufacturing a scintillator panel, the method comprising:
   mounting a plurality of substrates at positions away from a rotation center on a holder of an evaporative apparatus configured to perform a vapor deposition process while holding vapor deposition targets with the holder and rotating the holder; and
   forming scintillators over the plurality of substrates so as to have a concentric characteristics distribution having a center outside an outer edge of each of the plurality of substrates by performing a vapor deposition process for the plurality of substrates mounted in the mounting the plurality of substrates while rotating the holder of the evaporative apparatus.

* * * * *